(12) United States Patent
Hwang et al.

(10) Patent No.: US 9,196,062 B2
(45) Date of Patent: Nov. 24, 2015

(54) METHOD AND APPARATUS FOR GENERATING MAGNETIC RESONANCE IMAGE

(71) Applicants: SAMSUNG ELECTRONICS CO., LTD., Suwon-si (KR); KOREA UNIVERSITY RESEARCH AND BUSINESS FOUNDATION, Seoul (KR)

(72) Inventors: Jin-young Hwang, Suwon-si (KR); Su-hyung Park, Seoul (KR); Jaeseok Park, Seoul (KR)

(73) Assignees: SAMSUNG ELECTRONICS CO., LTD., Suwon-si (KR); KOREA UNIVERSITY RESEARCH AND BUSINESS FOUNDATION, Seoul (KR)

( * ) Notice: Subject to any disclaimer, the term of this patent is extended or adjusted under 35 U.S.C. 154(b) by 277 days.

(21) Appl. No.: 13/673,629

(22) Filed: Nov. 9, 2012

(65) Prior Publication Data

US 2013/0301891 A1 Nov. 14, 2013

(30) Foreign Application Priority Data

May 10, 2012 (KR) ........................ 10-2012-0049779

(51) Int. Cl.
*G06K 9/00* (2006.01)
*G06T 11/00* (2006.01)
*G01R 33/561* (2006.01)
*G01R 33/565* (2006.01)
*G06T 7/00* (2006.01)

(52) U.S. Cl.
CPC ............ *G06T 11/005* (2013.01); *G01R 33/565* (2013.01); *G01R 33/5611* (2013.01); *G06T 7/0012* (2013.01)

(58) Field of Classification Search
None
See application file for complete search history.

(56) References Cited

U.S. PATENT DOCUMENTS

| | | | | |
|---|---|---|---|---|
| 5,297,033 A * | 3/1994 | Bito et al. | ...................... | 324/309 |
| 5,910,728 A | 6/1999 | Sodickson | | |
| 6,198,283 B1 * | 3/2001 | Foo et al. | ...................... | 324/309 |
| 6,208,139 B1 * | 3/2001 | Foo et al. | ...................... | 324/309 |
| 6,289,232 B1 | 9/2001 | Jakob et al. | | |
| 6,841,998 B1 | 1/2005 | Griswold | | |
| 7,282,917 B1 * | 10/2007 | Brau et al. | ..................... | 324/318 |

(Continued)

FOREIGN PATENT DOCUMENTS

| | | |
|---|---|---|
| JP | 9238920 A | 9/1997 |
| JP | 2007510488 A | 4/2007 |

OTHER PUBLICATIONS

Sarty et al. "Direct Reconstruction of Non-Cartesian k-Space Data Using a Nonuniform Fast Fourier Transform," 2001, Magnetic Resonance in Medicine (45): pp. 908-915.*

(Continued)

*Primary Examiner* — Barry Drennan
*Assistant Examiner* — Samah Beg
(74) *Attorney, Agent, or Firm* — Sughrue Mion, PLLC

(57) ABSTRACT

A method of generating a magnetic resonance image includes: generating pieces of first interpolation data by interpolating pieces of data obtained from each of the plurality of coils; generating pieces of weighted data by weighting the pieces of first interpolation data with respect to a plurality of frequency bands; and obtaining the magnetic resonance image corresponding to a subject by using the pieces of weighted data.

18 Claims, 10 Drawing Sheets

(56) References Cited

U.S. PATENT DOCUMENTS

| | | | |
|---|---|---|---|
| 7,362,100 B2 | 4/2008 | Schulz et al. | |
| 7,916,144 B2* | 3/2011 | Schiwietz et al. | 345/501 |
| 8,638,096 B2* | 1/2014 | Zhang et al. | 324/309 |
| 8,901,927 B2* | 12/2014 | Gross | 324/309 |
| 2004/0051526 A1* | 3/2004 | Lee et al. | 324/307 |
| 2005/0203982 A1* | 9/2005 | Kolibal | 708/420 |
| 2005/0286804 A1* | 12/2005 | Hong | 382/300 |
| 2006/0022673 A1* | 2/2006 | Macovski | 324/307 |
| 2006/0250132 A1* | 11/2006 | Reeder et al. | 324/307 |
| 2008/0292167 A1* | 11/2008 | Todd et al. | 382/131 |
| 2008/0303521 A1* | 12/2008 | Beatty et al. | 324/312 |
| 2008/0304727 A1* | 12/2008 | Doyle | 382/131 |
| 2009/0262996 A1* | 10/2009 | Samsonov et al. | 382/130 |
| 2010/0034447 A1* | 2/2010 | Geier et al. | 382/131 |
| 2010/0142823 A1* | 6/2010 | Wang et al. | 382/195 |
| 2010/0322497 A1* | 12/2010 | Dempsey et al. | 382/131 |
| 2010/0329527 A1* | 12/2010 | Iannotti et al. | 382/131 |
| 2011/0148410 A1* | 6/2011 | Zaitsev et al. | 324/309 |
| 2011/0286648 A1* | 11/2011 | Sharif et al. | 382/131 |
| 2012/0092009 A1* | 4/2012 | Zhang et al. | 324/309 |
| 2013/0088225 A1* | 4/2013 | Weller et al. | 324/307 |
| 2013/0207652 A1* | 8/2013 | Weller et al. | 324/309 |
| 2013/0279786 A1* | 10/2013 | Lin et al. | 382/131 |
| 2013/0300413 A1* | 11/2013 | Hwang et al. | 324/309 |
| 2014/0133724 A1* | 5/2014 | Liu et al. | 382/131 |
| 2014/0266192 A1* | 9/2014 | Taviani et al. | 324/309 |
| 2014/0286560 A1* | 9/2014 | Trzasko et al. | 382/131 |

OTHER PUBLICATIONS

Noll et al. "Magnetic resonance reconstruction from projections using half the data," SPIE vol. 1443 Medical Imaging V: Image Physics (1991): pp. 29-36.*

J.G. Pipe, "Reconstructing MR Images From Undersampled Data: Data-Weighting Considerations," Magnetic Resonance in Medicine 2000 (43): pp. 867-875.*

Moriguchi et al. "Novel partial Fourier reconstruction technique using FOCUSS," Proc. Intl. Soc. Mag. Reson. Med. 19 (2011): p. 2844.*

Communication, dated Aug. 30, 2013, issued by the Korean Intellectual Property Office in counterpart Korean Application No. 10-2012-0049779.

* cited by examiner

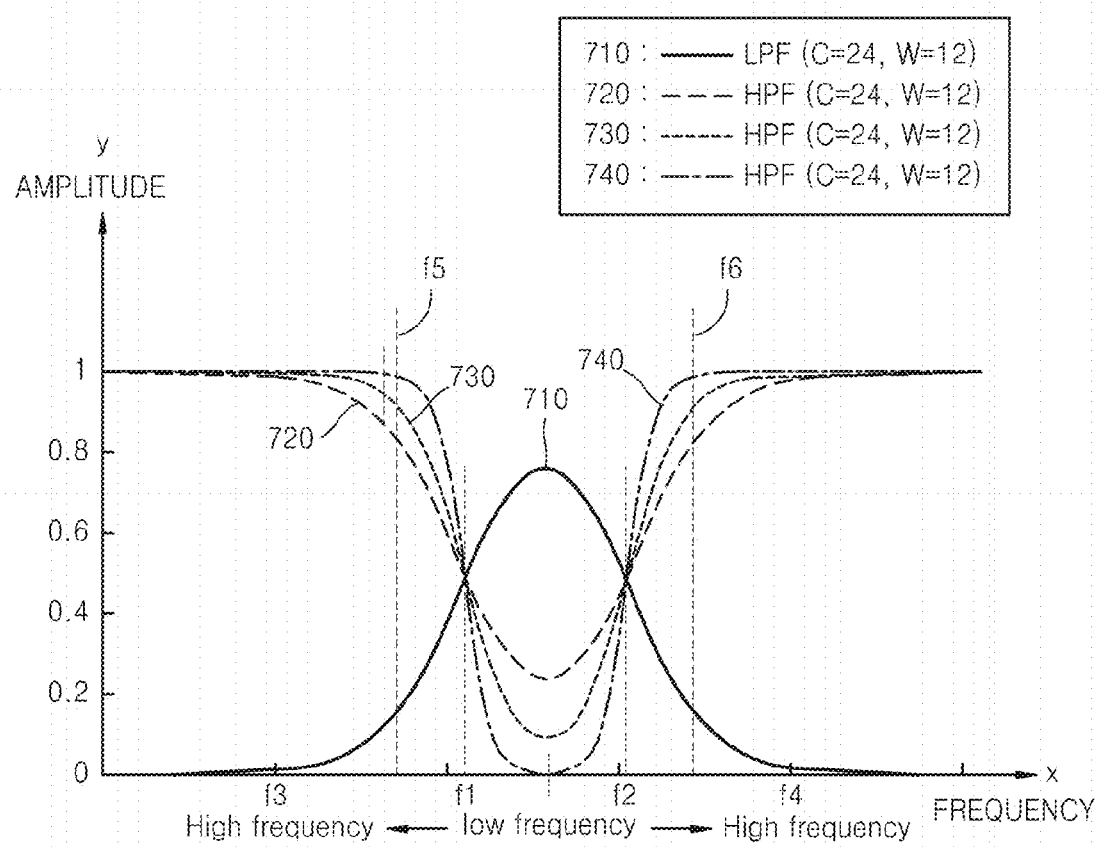

METHOD AND APPARATUS FOR GENERATING MAGNETIC RESONANCE IMAGE

CROSS-REFERENCE TO RELATED PATENT APPLICATION

This application claims priority from Korean Patent Application No. 10-2012-0049779, filed on May 10, 2012, in the Korean Intellectual Property Office, the disclosure of which is incorporated herein in its entirety by reference.

BACKGROUND

1. Field

Exemplary embodiments relate to methods and apparatuses for generating a magnetic resonance image.

2. Description of the Related Art

Magnetic resonance imaging (MRI) apparatuses are used to obtain an image of a subject by using a magnetic field, to accurately diagnose diseases since MRI apparatuses show a stereoscopic image of bones, discs, joints, nerve ligaments, etc., at a desired angle.

The MRI apparatus obtains a magnetic resonance (MR) signal and reconstructs the obtained MR signal to output an image. The MRI apparatus obtains an MR signal by using radio frequency (RF) coils, a permanent magnet, a gradient coil, and the like. When an MR signal is obtained, an erroneous signal may be generated because the MR signal is not measured in joining parts of adjacent RF coils. Therefore, noise or artifacts may be present in a reconstructed magnetic resonance image due to the invalid non-measured signal or incorrectly measured signal. In addition, while K-space data obtained from RF coils is reconstructed as a magnetic resonance image, noise in the K-space data may be amplified. Below, the invalid signal referred as 'non-measured signal'.

Accordingly, in order to output a magnetic resonance image from which the artifacts and noise are removed, an MR signal has to be corrected by performing image processing such as calibration or the like.

MRI methods of processing an obtained MR signal include sensitivity encoding (SENSE) method, a generalized auto-calibrating partially parallel acquisition (GRAPPA) method, and the like.

An image-based imaging method, such as the SENSE method, obtains coil sensitivity information by separating an image corresponding to each individual coil through self-calibration in an image space. An image of each individual coil is obtained by performing an inverse Fourier transform on central portion of data in a K-space which has been Nyquist-sampled. In the case of reconstructing a magnetic resonance image by using the coil sensitivity information, image-based self-calibration needs very accurate coil sensitivity information.

Accordingly, in a central portion of K-space data, a large number of calibration signals is required, and a time taken to form an image increases. In addition, when a field of view (FOV) is smaller than a subject to be imaged, the image-based self-calibration may cause residual aliasing artifacts during image reconstruction.

A K-space-based imaging method, such as the GRAPPA method, calculates spatial correlations (or convolution kernels) between a calibration signal and an adjacent measured source signal through self-calibration. The GRAPPA method does not need accurate coil sensitivity information and is not limited in reconstruction of the FOV. However, when pieces of data of an image signal are damaged due to noise and spatial correlations are changed, residual aliasing artifacts and amplified noise occur in a reconstructed image.

Accordingly, there is a need for MRI methods and apparatuses which are capable of reducing aliasing artifacts and noise occurring when pieces of data of an MR image signal are missing or damaged.

SUMMARY

Exemplary embodiments may address at least the above problems and/or disadvantages and other disadvantages not described above. Also, exemplary embodiments are not required to overcome the disadvantages described above, and an exemplary embodiment may not overcome any of the problems described above.

One or more exemplary embodiments provide a method of generating a magnetic resonance image, which is capable of reducing aliasing artifacts and noise.

One or more exemplary embodiments provide an apparatus for generating a magnetic resonance image, which is capable of reducing aliasing artifacts and noise.

One or more exemplary embodiments provide a method of generating a magnetic resonance image, which is capable of reducing residual aliasing artifacts and noise while maintaining the accuracy of the magnetic resonance image.

One or more exemplary embodiments provide an apparatus for generating a magnetic resonance image, which is capable of reducing residual aliasing artifacts and noise while maintaining the accuracy of the magnetic resonance image.

According to an aspect of an exemplary embodiment, there is provided a method of generating a magnetic resonance image by using an RF multi-coil including a plurality of coils, the method including: generating pieces of first interpolation data by interpolating pieces of data obtained from each of the plurality of coils; generating pieces of weighted data by weighting the pieces of first interpolation data with respect to each of a plurality of frequency bands; and obtaining the magnetic resonance image corresponding to a subject by using the pieces of weighted data.

The generating of the pieces of weighted data may include generating the pieces of weighted data by performing K-space weighting on the pieces of first interpolation data in a K-space with respect to each of the plurality of frequency bands.

The plurality of frequency bands may include a low frequency band and an RF band, and the generating of the pieces of weighted data may include: generating pieces of weighted data corresponding to the low frequency band by low-pass filtering the pieces of first interpolation data; and generating pieces of weighted data corresponding to the RF band by high-pass filtering the pieces of first interpolation data by applying different weighting values.

The obtaining of the magnetic resonance image may include generating pieces of second interpolation data by interpolating the pieces of weighted data in at least one of the plurality of frequency bands.

The obtaining of the magnetic resonance image may include: generating pieces of second interpolation data by interpolating the pieces of weighted data in at least one of the plurality of frequency bands; obtaining a plurality of restoration images corresponding to the plurality of coils by performing a weighted combination on at least one of the pieces of weighted data and at least one of the pieces of second interpolation data; and obtaining the magnetic resonance image by using the plurality of restoration images.

The generating of the pieces of second interpolation data may include generating the pieces of second interpolation data by interpolating the pieces of weighted data through a convolution interpolation method, in the at least one of the plurality of frequency bands.

The obtaining of the magnetic resonance image may include: performing an inverse fast Fourier transform on the plurality of restoration images; and obtaining the magnetic resonance image based on the inverse fast Fourier transformed-restoration images.

The obtaining of the magnetic resonance image may include obtaining the magnetic resonance image by the sum of squares of the inverse fast Fourier transformed-restoration images.

The generating of the pieces of first interpolation data may include generating the pieces of first interpolation data by interpolating the pieces of data through a convolution interpolation method.

According to an aspect of an exemplary embodiment, there is provided an apparatus for generating a magnetic resonance image, the apparatus including: a data processor that generates pieces of first interpolation data by interpolating pieces of data obtained from each of a plurality of coils; a frequency band-based processor that generates pieces of weighted data by weighting the pieces of first interpolation data with respect to each of a plurality of frequency bands; and an image generator that obtains a magnetic resonance image corresponding to a subject by using the pieces of weighted data.

The frequency band-based processor may generate the pieces of weighted data by performing K-space weighting on the pieces of first interpolation data in a K-space with respect to each of the plurality of frequency bands.

The frequency band-based processor may include: at least one low pass filter that generates the pieces of weighted data by low-pass filtering the pieces of first interpolation data; and a high pass filter including a plurality of high pass filters that each high-pass filter the pieces of first interpolation data by applying a predetermined weighting value, wherein different weighting values are applied to the plurality of high pass filters.

The data processor may include: a data receiver that receives the pieces of data; and a first interpolator that generates the pieces of first interpolation data by interpolating the pieces of data corresponding to the plurality of coils through a convolution interpolation method.

The image generator may include: a second interpolator that generates pieces of second interpolation data by interpolating the pieces of weighted data in at least one of the plurality of frequency bands; a restoration image generator that obtains a plurality of restoration images corresponding to the plurality of coils by using at least one of the pieces of weighted data and at least one of the pieces of second interpolation data; and a magnetic resonance image generator that obtains the magnetic resonance image by using the plurality of restoration images.

The magnetic resonance image generator may perform an inverse fast Fourier transform on the plurality of restoration images and may obtain the magnetic resonance image based on the inverse fast Fourier transformed-restoration images.

The magnetic resonance image generator may obtain the magnetic resonance image by the sum of squares of the inverse fast Fourier transformed-restoration images.

The restoration image generator may obtain the plurality of restoration images corresponding to the plurality of coils by performing a weighted combination on at least one of the pieces of weighted data and at least one of the pieces of second interpolation data.

The image generator may include: a second interpolator that generates the pieces of second interpolation data corresponding to the plurality of high pass filters, respectively, by interpolating pieces of weighted data, which are output from the plurality of high pass filters, respectively, through a convolution interpolation method; a restoration image generator that generates a restoration image by performing a weighted combination on weighted data, which is output from the low pass filter, and the pieces of second interpolation data, with respect to each of the plurality coils; and a magnetic resonance image generator that obtains the magnetic resonance image by using the plurality of restoration images corresponding to the plurality of coils.

According to an aspect of an exemplary embodiment, there is provided a method of obtaining a magnetic resonance image by using an RF multi-coil including a plurality of coils, the method including: generating pieces of first interpolation data by interpolating pieces of data obtained from the plurality of coils; and generating pieces of second interpolation data by interpolating data corresponding to the pieces of first interpolation data.

BRIEF DESCRIPTION OF THE DRAWINGS

The above and/or other aspects will become more apparent by describing certain exemplary embodiments, with reference to the accompanying drawings, in which:

FIG. 7 is a graph for describing an example of an operation of a frequency band-based processor of FIG. 5;

DETAILED DESCRIPTION

Figure 1:
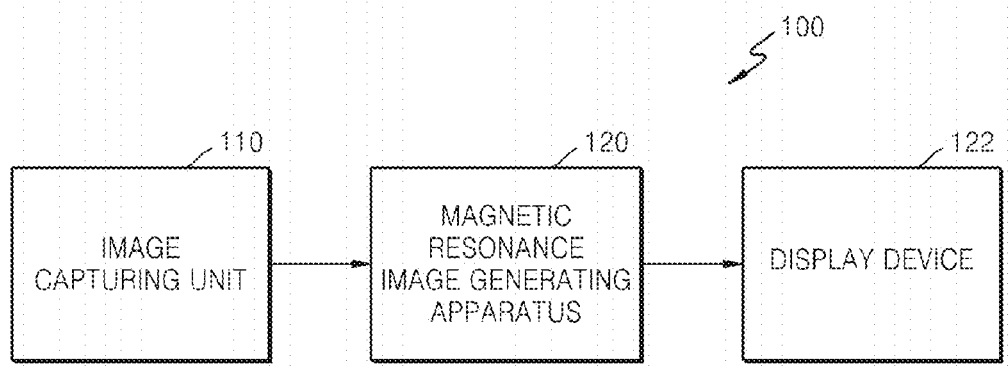
FIG. 1 is a block diagram of an MRI system according to an exemplary embodiment.

Certain exemplary embodiments are described in detail below with reference to the accompanying drawings.

In the following description, the same drawing reference numerals are used for the same elements even in different drawings. The matters defined in the description, such as detailed construction and elements, are provided to assist in a comprehensive understanding of exemplary embodiments. Thus, it is apparent that exemplary embodiments can be carried out without those specifically defined matters. Also, well-known functions or constructions are not described in detail since they would obscure exemplary embodiments with unnecessary detail.

As used herein, the term "and/or" includes any and all combinations of one or more of the associated listed items. Expressions such as "at least one of," when preceding a list of elements, modify the entire list of elements and do not modify the individual elements of the list.

FIG. 1 is a block diagram of an MRI system 100 including a magnetic resonance image generating apparatus 120 according to an exemplary embodiment.

Referring to FIG. 1, the MRI system 100 includes an image capturing unit 110 and the magnetic resonance image generating apparatus 120 according to an exemplary embodiment.

The image capturing unit 110 includes a gradient coil (not shown) and a multi-coil (not shown) including a plurality of RF coils, and generates data by capturing an image of a subject by using the multi-coil, based on a K-space that is adjusted by driving the gradient coil. The image capturing unit 110 is described in detail with reference to FIG. 2 below. The data generated by the image capturing unit 110 may be K-space data. The K-space data is a set of raw data from which an image may be made.

The magnetic resonance image generating apparatus 120 receives pieces of data that are transmitted from the image capturing unit 110. The pieces of data may be images including image information of the K-space, which has been obtained from each of the plurality of RF coils included in the multi-coil of the image capturing unit 110.

The magnetic resonance image generating apparatus 120 generates a magnetic resonance image by processing the received pieces of data. The processing of the received pieces of data may include an image processing operation of restoring a non-measured signal and removing residual aliasing artifacts and noise. An image processing operation of the magnetic resonance image generating apparatus 120 is described in detail with reference to FIG. 3 below. The generated magnetic resonance image is displayed on a display device 122 or output to a remotely located device such as a personal computer or a workstation.

Figure 2:
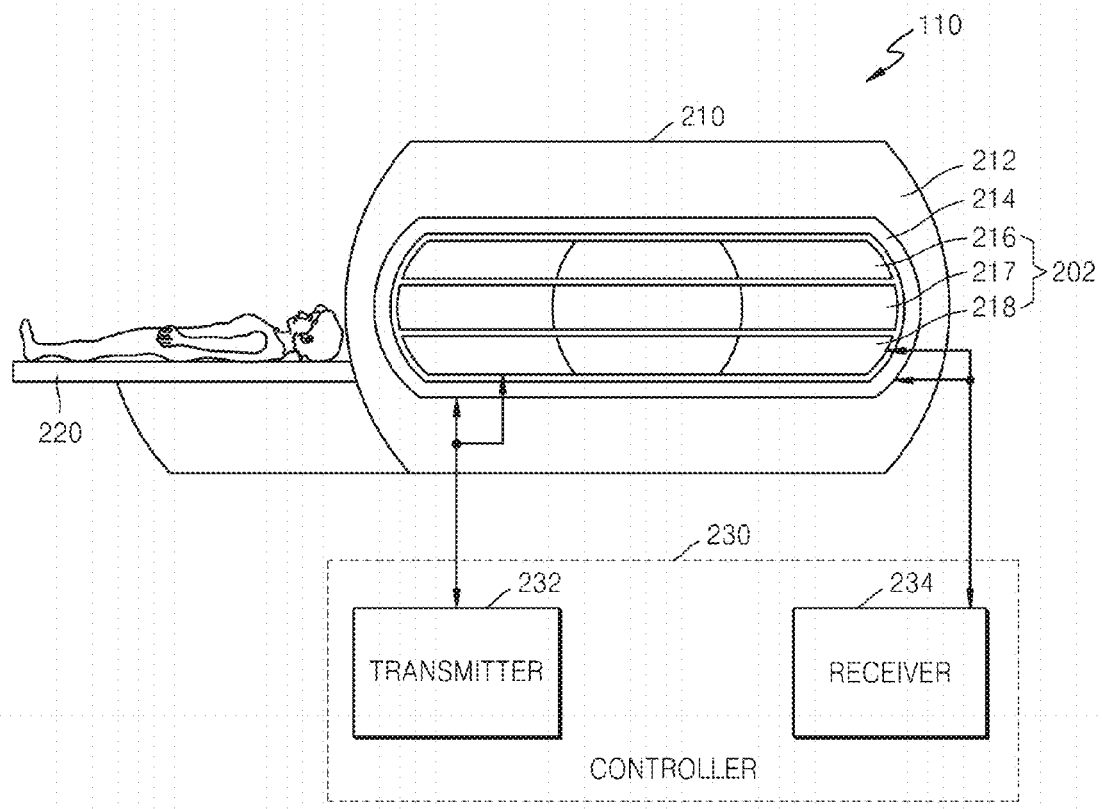
FIG. 2 is a diagram illustrating an image capturing unit illustrated in FIG. 1 in detail.

FIG. 2 is a diagram illustrating an image capturing unit 110 of FIG. 1 in detail.

Referring to FIG. 2, the image capturing unit 110 includes an MRI scanner 210 and a controller 230.

The MRI scanner 210 includes a main magnet 212, a secondary magnetic field apparatus, and a patient bed 220.

The main magnet 212, which is a magnet for forming a main magnetic field, may include a permanent magnet, a superconducting electromagnet, or the like, and may be a cylindrical magnet disposed around a bore.

The secondary magnetic field apparatus for forming a sub-magnetic field may include a gradient coil 214 and RF multi-coil set 202 including RF coils 216, 217, and 218. Although three RF coils are illustrated and described, the RF multi-coil set 202 may include two, four, five, etc., RF coils.

The gradient coil 214 forms a gradient magnetic field in the x, y, and z directions and is used for setting a field of view (FOV) that is a section in which a subject is imaged.

The RF coils 216, 217, 218 are driven to propagate radio waves for inducing a resonance phenomenon. A K-space image is generated by receiving an RF signal that is generated by driving the plurality of coils 216, 217, and 218.

The controller 230 drives magnets included in the MRI scanner 210. The controller 230 outputs an RF signal to the MRI scanner 210 and receives an RF signal that is generated corresponding to the output RF signal. Then, the controller 230 generates pieces of data corresponding to the plurality of RF coils 216, 217, and 218, based on the received RF signal.

In detail, the controller 230 may include a transmitter 232 and a receiver 234. The transmitter 232 generates the RF signal and outputs the RF signal to the MRI scanner 210. The MRI scanner 210 generates a magnetic resonance signal according to the RF signal generated by the transmitter 232.

The receiver 234 receives the magnetic resonance signal generated by the MRI scanner 210 as an RF signal. Then, the receiver 234 generates raw data based on the received RF signal. The raw data is data of the K-space described above, and the receiver 234 may generate n pieces of data (where n is a natural number) corresponding to a number n of RF coils included in the RF multi-coil set 202.

The n pieces of data generated by the receiver 234 are transmitted to the magnetic resonance image generating apparatus 120 of FIG. 1, and are processed to generate a final magnetic resonance image.

Figure 3:
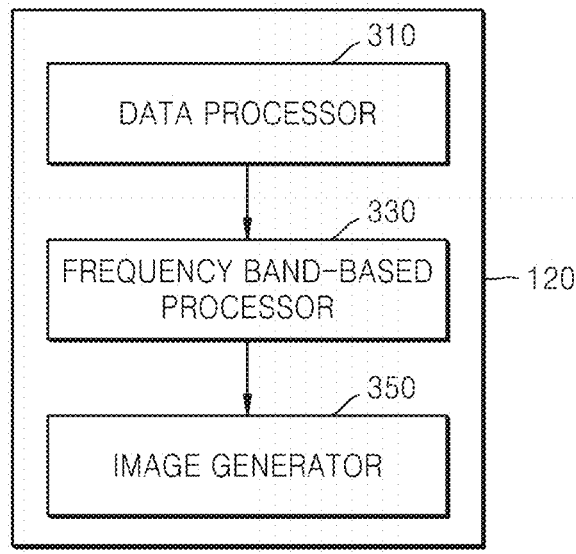
FIG. 3 is a block diagram of a magnetic resonance image generating apparatus according to an exemplary embodiment.

FIG. 3 is a block diagram of a magnetic resonance image generating apparatus 120 according to an exemplary embodiment.

Referring to FIG. 3, the magnetic resonance image generating apparatus 120 includes a data processor 310, a frequency band-based processor 330, and an image generator 350. The magnetic resonance image generating apparatus 120 receives pieces of data obtained from a multi-coil including a plurality of coils and generates a magnetic resonance image by using the received pieces of data. The pieces of data that are received by the magnetic resonance image generating apparatus 120 may be the raw data generated by the K-space described above.

The data processor 310 generates pieces of first interpolation data by interpolating the pieces of data obtained from each of the plurality of RF coils 216, 217, and 218 included in the RF multi-coil set 202, wherein each of the plurality of RF coils generates corresponding K-space data.

In an example described below, the data processor 310 receives n pieces of data (where n is a natural number) obtained from each of n coils and generates n pieces of first interpolation data corresponding to the n pieces of data.

In detail, the data processor 310 may receive the pieces of data, i.e., the n pieces of data, obtained from each of the n coils. An another example, the data processor 310 may receive RF signals corresponding to the n coils and may obtain data by sampling the received RF signals via variable density sampling in a K-space. For example, in a K-space corresponding to a predetermined coil, data corresponding to the coil may be generated by Nyquist sampling in a central portion of the K-space and undersampling in a peripheral portion of the K-space.

The data may be formed of image signals that are distributed in the K-space. In addition, the K-space indicates a space in which one axis includes frequency encoding information and another axis, which is perpendicular to the one axis, includes phase encoding information.

As described above, the data processor 310 may receive n pieces of data of the K-space, which correspond to the n coils, from the image capturing unit 110, or may receive RF signals corresponding to the n coils and then generate n pieces of data of the K-space based on the received RF signals.

The data processor 310 generates n pieces of first interpolation data by interpolating the n pieces of data. The interpolation may be performed by self-calibration of each of the n pieces of data. In detail, the interpolation may be performed by using a convolution interpolation method. Accordingly, the n pieces of first interpolation data, in which image information lost during image capturing and non-measured image information have been restored and which correspond to the n coils, are generated.

The frequency band-based processor 330 generates weighted data sets by weighting the first interpolation data obtained from the data processor 310 with respect to each of a plurality of frequency bands.

In detail, the frequency band-based processor 330 generates the weighted data sets by performing K-space weighting on the first interpolation data with respect to each of the plurality of frequency bands. The frequency band-based processor 330 generates n weighted data sets corresponding to the n pieces of first interpolation data with respect to each of the plurality of frequency bands.

The image generator 350 obtains a magnetic resonance image corresponding to a subject by using the weighted data sets with respect to each of the plurality of frequency bands.

Figure 4:
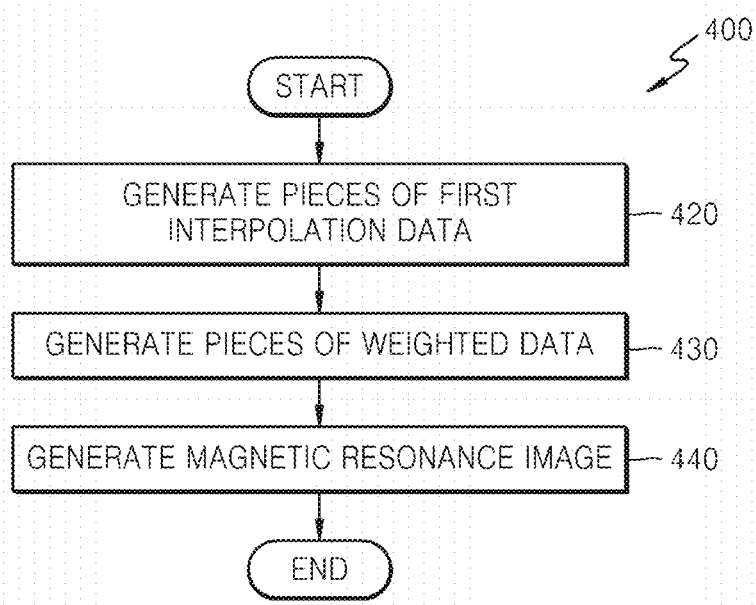
FIG. 4 is a flowchart illustrating a method of generating a magnetic resonance image, according to an exemplary embodiment.

FIG. 4 is a flowchart illustrating a method 400 of generating a magnetic resonance image, according to an exemplary embodiment.

The method 400 of generating a magnetic resonance image is described with reference to the magnetic resonance image generating apparatus 120 illustrated in FIGS. 1 and 3 and a magnetic resonance image is obtained by using an RF multi-coil set 202.

In operation 420, pieces of first interpolation data are generated by interpolating pieces of data obtained from each of a plurality of coils. Operation 420 may be performed by the data processor 310.

In operation 430, weighted data sets are generated by weighting the pieces of first interpolation data generated by operation 420 with respect to each of a plurality of frequency bands. Operation 430 may be performed by the frequency band-based processor 330.

In detail, in operation 430, the weighted data sets may be generated by performing K-space weighting on the pieces of first interpolation data with respect to each of the plurality of frequency bands.

In operation 440, a magnetic resonance image of a subject is obtained by using the weighted data sets generated by operation 430. Operation 440 may be performed by the image generator 350.

The method 400 of generating a magnetic resonance image is described in detail with reference to FIG. 6 below.

Figure 5:
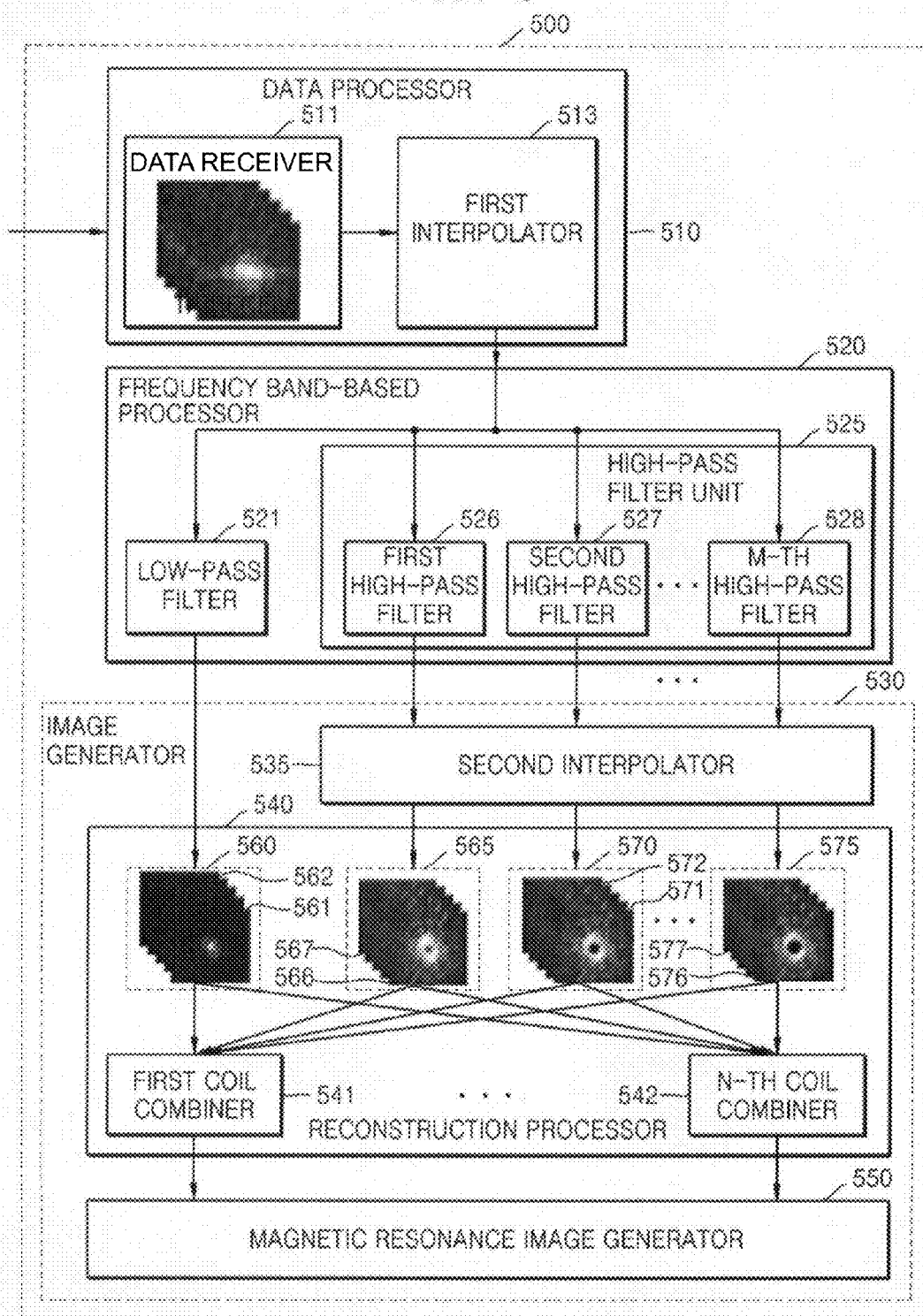
FIG. 5 is a block diagram of a magnetic resonance image generating apparatus according to an exemplary embodiment.

FIG. 5 is a block diagram of a magnetic resonance image generating apparatus 500 according to an exemplary embodiment. The magnetic resonance image generating apparatus 500 corresponds to the magnetic resonance image generating apparatus 120 illustrated in FIG. 3. In detail, a data processor 510, a frequency band-based processor 520, and an image generator 530 of FIG. 5 correspond to the data processor 310, the frequency band-based processor 330, and the image generator 350 of FIG. 3, respectively. Thus, repeated descriptions are not provided.

Referring to FIG. 5, the data processor 510 may include a data receiver 511 and a first interpolator 513.

The data receiver 511 may receive pieces of data obtained from each of a plurality of coils. The data receiver 511 may receive RF signals corresponding to the plurality of coils, and obtain data by sampling received RF signals by variable density sampling in a K-space. The data receiver 511 transmits n pieces of data corresponding to n coils to the first interpolator 513.

The first interpolator 513 interpolates the n pieces of data transmitted from the data receiver 511 and outputs n pieces of first interpolation data. For example, the first interpolator 513 interpolates the n pieces of data transmitted from the data receiver 511 by using interpolating method such as self-calibration.

The frequency band-based processor 520 includes at least one low-pass filter 521 and a high-pass filter unit 525. In FIG. 5, the frequency band-based processor 520 includes a single low-pass filter 521 as an example. However, the frequency band-based processor 520 may include two, three, four, etc., low-pass filters.

The low-pass filter 521 generates n pieces of weighted data set 560 of a low frequency band, with correspondence to the n coils, by low-pass filtering the n pieces of first interpolation data corresponding to the n coils. For example, a weighting value 1 is applied to the low-pass filter 521, and thus, the n pieces of first interpolation data are not be weighted and are only low-pass filtered.

In FIG. 5, a weighted data piece 561 illustrated at the beginning of the weighted data set 560 indicates weighted data corresponding to the data obtained from a first coil of the n coils, and a weighted data piece 562 illustrated at the end of the weighted data set 560 indicates weighted data corresponding to the data obtained from an n-th coil of the n coils. The weighted data pieces illustrated in between the weighted data piece 561 and the weighted data piece 562 correspond to the second through n–1 coils.

The high-pass filter unit 525 includes a plurality of high-pass filters. In FIG. 5, the high-pass filter unit 525 includes first and second through m-th high-pass filters 526, 527, and 528 (where m is a natural number) as an example. Each of the first through m-th high-pass filters 526, 527, and 528 high-pass filters the n pieces of first interpolation data, and applies a weighting value thereto. The M weighting values are applied to the first through m-th high-pass filters 526, 527, and 528 and may be different values between 0 and 1.

Accordingly, the high-pass filter unit 525 may output m weighed data sets each including n pieces of weighted data which correspond to a high frequency band, i.e., an RF band, and to which m weighting values have been applied, respectively. For example, a first weighting value is applied to the first high-pass filter 526, and the first high-pass filter 526 generates n pieces of weighted data corresponding to an RF band and the first weighting value. A second weighting value is applied to the second high-pass filter 527, and the second high-pass filter 527 generates n pieces of weighted data corresponding to an RF band and the second weighting value. An m-th weighting value is applied to the m-th high-pass filter 528, and the m-th high-pass filter 528 generates n pieces of weighted data corresponding to an RF band and the m-th weighting value. The n pieces of weighted data generated by each of the high-pass filters correspond to the data pieces obtained from the n coils, respectively. The RF frequency band may be the same for each high-filter or may be different for some or all of the high-pass filters.

The operation of the low-pass filter 521 and the high-pass filter unit 525 are described in detail with reference to FIG. 7 below.

The image generator 530 may include a second interpolator 535, a reconstruction processor 540, and a magnetic resonance image generator 550.

The second interpolator 535 generates at least one second interpolation data set by interpolating weighted data in at least one of a plurality of frequency bands.

In detail, the second interpolator 535 interpolates the m weighted data sets output from the high-pass filter unit 525 and outputs m second interpolation data sets. The interpolation may be performed by using a convolution interpolation method.

In detail, the second interpolator 535 interpolates n pieces of weighted data generated by the first high-pass filter 526 and outputs n pieces of second interpolation data 565, interpolates n pieces of weighted data generated by the second high-pass filter 527 and outputs n pieces of second interpolation data 570, and interpolates n pieces of weighted data generated by the m-th high-pass filter 528 and outputs n pieces of second interpolation data 575.

The reconstruction processor 540 obtains a plurality of reconstructed images corresponding to each of the plurality of coils by performing a weighted combination on at least one of the n pieces of the weighted data set 560 output from the low-pass filter 521 and a corresponding one of the n pieces of at least one of the second interpolation data sets with respect to each of the plurality of coils output from the second interpolator 535.

The reconstruction processor 540 includes first through n-th coil combiners 541, 542 that each generates n reconstructed images corresponding to the n coils. Each of the first through n-th coil combiners 541 and 542 obtains a reconstructed image corresponding to a predetermined coil by combining a piece of the weighted data set, which corresponds to the predetermined coil, and a corresponding piece of one or more of second interpolation data sets, which correspond to the predetermined coil.

For example, the first coil combiner 541 generates a first reconstructed image corresponding to an image obtained from the first coil by combining the weighted data 561, which corresponds to the first coil, of the weighted data set 560 output from the low-pass filter 521, and pieces of second interpolation data 566, 571, and 576, which correspond to the first coil, of second interpolation data sets 565, 570, and 575 generated by the second interpolator 535.

The n-th coil combiner 542 generates an n-th reconstructed image corresponding to an image obtained from the n-th coil by combining the weighted data 562, which corresponds to the n-th coil, of the weighted data set 560 output from the low-pass filter 521, and pieces of second interpolation data 567, 572, and 577, which correspond to the n-th coil, of second interpolation data sets 565, 570, and 575 generated by the second interpolator 535.

The magnetic resonance image generator 550 obtains a magnetic resonance image by using a plurality of reconstructed images corresponding to the plurality of coils.

In detail, the magnetic resonance image generator 550 performs an inverse fast Fourier transform on n reconstructed images corresponding to the n coils, and obtains a magnetic resonance image based on the n inverse fast Fourier transformed-reconstructed images. The magnetic resonance image generator 550 performs an inverse fast Fourier transform on the n reconstructed images corresponding to the n coils, and may obtain a magnetic resonance image by the sum of squares of the n inverse fast Fourier transformed-reconstructed images.

Figure 6:
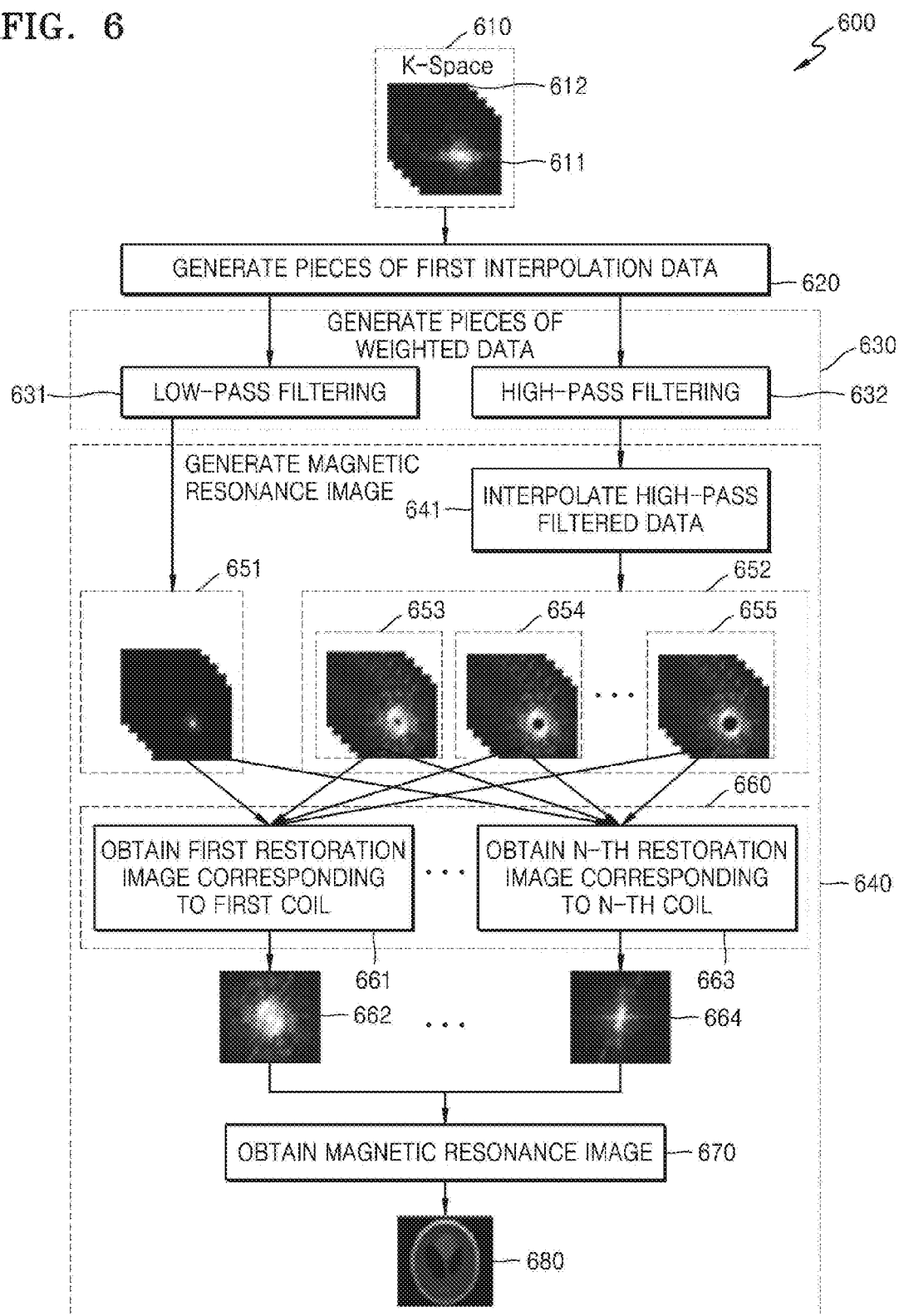
FIG. 6 is a diagram illustrating a method of generating a magnetic resonance image, according to an exemplary embodiment.

FIG. 6 is a diagram illustrating a magnetic resonance image generating method 600, according to an exemplary embodiment. Operations 620, 630, and 640 of FIG. 6 correspond to operations 420, 430, and 440 of FIG. 4, respectively. Thus, repeated descriptions are not provided. Below, the magnetic resonance image generating method 600 of FIG. 6 is described with reference to the magnetic resonance image generating apparatus 500 illustrated in FIG. 5.

In the magnetic resonance image generating method 600, pieces of data 610 obtained from each of a plurality of coils may be received from the outside or may be generated internally.

In detail, the pieces of data 610 are composed of image information of a K-space as described above, and include n pieces of data of a K-space that have been obtained from each of the n coils.

The pieces of data 610 may be received or obtained from the data receiver 511.

For example, each of the pieces of data 610 includes frequency encoding information in regard to the x-axis and phase encoding information in regard to the y-axis. In an example of FIG. 6, the data 611 illustrated at the beginning of the pieces of data 610 is K-space data that has been obtained from a first coil, and data 612 illustrated at the end of the pieces of data 610 is K-space data that has been obtained from an n-th coil.

Operation 620 corresponds to operation 420 of FIG. 4. Operation 620 may be performed by the first interpolator 513.

In operation 630, the weighted data sets are generated by weighting pieces of the first interpolation data generated by operation 620 with respect to a plurality of frequency bands. The plurality of frequency bands may include a low frequency band and a high frequency band, i.e., an RF band.

In detail, in operation 631, the weighted data set corresponding to the low frequency band is generated by low-pass filtering the pieces of first interpolation data. In operation 632, the weighted data sets corresponding to the RF band are generated by high-pass filtering the pieces of first interpolation data by applying different weighting values, respectively. Operation 631 may be performed by the low-pass filter 521, and operation 632 may be performed by the high-pass filter unit 525.

Operation 640 corresponds to operation 440 of FIG. 4, and a magnetic resonance image corresponding to a subject is obtained by using the weighted data sets generated by operation 630.

In detail, in operation 641, pieces of the second interpolation data sets are generated by interpolating the multiple pieces of the weighted data sets in at least one of a plurality of frequency bands. Operation 641 may be performed by the second interpolator 535.

Weighted data set 651 and second interpolation data sets 653, 654, and 655 correspond to the weighted data set 560 and the second interpolation data sets 565, 570, and 575 illustrated in FIG. 5, respectively.

In operation 660, a plurality of reconstructed images are obtained by performing a weighted combination on the weighted data set 651 and at least one of the second interpolation data set 653, 654, and 655 with respect to each of the plurality of coils. Operation 660 may be performed by the reconstruction processor 540.

In operation 661, a first reconstructed image 662 corresponding to the first coil may be generated by the first coil combiner 541. As understood by those skilled in the art, the reconstructed images corresponding to a second through n−1 coils are obtained in a similar described-above manner.

In operation 663, an n-th reconstructed image 664 corresponding to the n-th coil may be generated by the n-th coil combiner 542.

In operation 670, a magnetic resonance image 680 is obtained by using the plurality of reconstructed images corresponding to the plurality of coils. Operation 670 may be performed by the magnetic resonance image generator 550.

FIG. 7 is a graph for describing an operation of the frequency band-based processor 520 of FIG. 5.

In FIG. 7, the x-axis indicates frequency and the y-axis indicates an amplitude value of a filtered signal. The amplitude value of the filtered signal is 1 when an amplitude of the filtered original signal is maintained at 100 percent, and the amplitude value of the filtered signal is 0 when the amplitude of the filtered original signal is maintained at 0 percent. In an example of FIGS. 5 and 7, three high-pass filters are included in the high-pass filter unit 525. Thus, the case where the m-th high-pass filter is a third high-pass filter is described below as an example.

Referring to FIG. 7, a curve 710 is a filter characteristic curve of the low-pass filter 521 and a curve 720 is a filter characteristic curve of the first high-pass filter 526. A curve 730 is a filter characteristic curve of the second high-pass filter 527, and a curve 740 is a filter characteristic curve of the m-th high-pass filter 528.

For example, a signal value that is output from the low-pass filter 521 may be calculated by Equation 1 below, and a signal value that is output from the first, second, or mth high-pass filter 526, 527, or 528 may be calculated by Equation 2 below.

$$LPF = \left[1 + \exp\{(\sqrt{k_x^2 + k_y^2} - c)/w\}\right]^{-1} - \left[1 + \exp\{(\sqrt{k_x^2 + k_y^2} + c)/w\}\right]^{-1} \quad (1)$$

$$HPF = 1 - \left[1 + \exp\{(\sqrt{k_x^2 + k_y^2} - c)/w\}\right]^{-1} + \left[1 + \exp\{(\sqrt{k_x^2 + k_y^2} + c)/w\}\right]^{-1} \quad (2)$$

where $K_x$ is a signal value of the x-axis coordinate of K-space data, $K_y$ is a signal value of the y-axis coordinate of the K-space data, c is a coefficient value for adjusting a cutoff frequency of a filter, w is a coefficient value for adjusting smoothness of a transition period of a filter characteristic curve, LPF is a signal value that is output by being filtered by the low-pass filter 521, and HPF is a signal value that is output by being filtered by the first, second, or mth high-pass filter 526, 527, or 528.

An LPF value of Equation 1 may be changed according to characteristics of the low-pass filter 521 included in the frequency band-based processor 520, and an HPF value of Equation 2 may be changed according to characteristics of the first, second, or mth high-pass filter 526, 527, or 528 included in the frequency band-based processor 520.

Referring to FIG. 7 and Equation 1, the low-pass filter 521 passes a signal component of a low frequency band and outputs the passed signal, and blocks a signal component of a high frequency band.

Referring to FIG. 7 and Equation 2, the first, second, or mth high-pass filter 526, 527, or 528 blocks a signal component of a low frequency band, and passes a signal component of a high frequency band and outputs the passed signal. In the first, second, or mth high-pass filter 526, 527, or 528, a degree of blocking a signal of a low frequency band may be changed according a weighting value Vw that is applied to the first, second, or mth high-pass filter 526, 527, or 528. In addition, a degree of blocking a signal of a low frequency band may be changed according to coefficients c and w of Equations 1 and 2, and the weighting value Vw that is applied to the first, second, or mth high-pass filter 526, 527, or 528 may be adjusted by adjusting the coefficients c and w.

In detail, the weighting value Vw may be increased as a degree of blocking a signal of a low frequency band is large.

For example, in operation 430 described above, when weighting the first interpolation data by applying a larger weighting value to the first interpolation data in a predetermined frequency band, for example, a high frequency band, more signal components of the high frequency band are included in the first interpolation data.

For example, a weighting value Vw that is applied to the m-th high-pass filter 528 almost blocking signal components of a low frequency band may be 1, a weighting value Vw that is applied to the second high-pass filter 527 may be 0.8, and a weighting value Vw that is applied to the first high-pass filter 526 may be 0.6.

In addition, the coefficients c and w or the weighting value Vw that are applied to the respective first, second, and mth high-pass filters 526, 527, and 528 may be experimentally optimized according to accuracy and degree of interpolation of signals that are output from the second interpolator 535, or according to image quality of a magnetic resonance image that is generated by the image generator 550.

In addition, a range of a low frequency band, in which the low-pass filter 521 passes a signal component, may be a frequency range from f3 to f4 or to a frequency range from f1 to f2, which are filtering bands indicated in the filter characteristic curve 710 of the low-pass filter 521 in FIG. 7. A range of a high frequency band, in which the first, second, or mth high-pass filter 526, 527, or 528 filters a signal component, may be determined as a frequency band equal to or greater than f5 or a frequency band equal to or greater than f6, which are filtering bands indicated in the filter characteristic curves 720, 730, and 740 of the high-pass filter operating graph of FIG. 7.

Figure 8A:
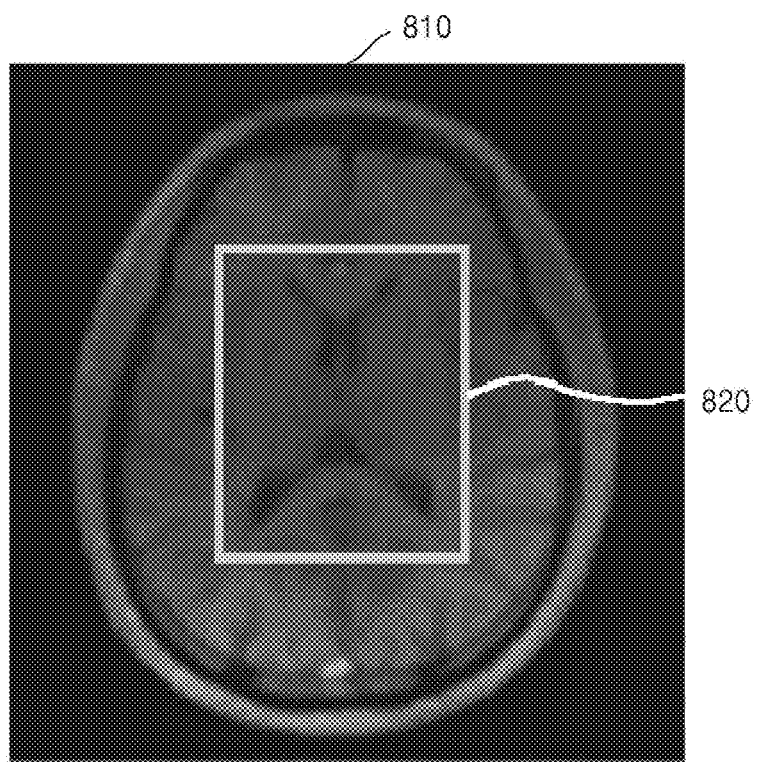
FIGS. 8A and 8B are magnetic resonance images obtained according to a GRAPPA method.
Figure 8B:
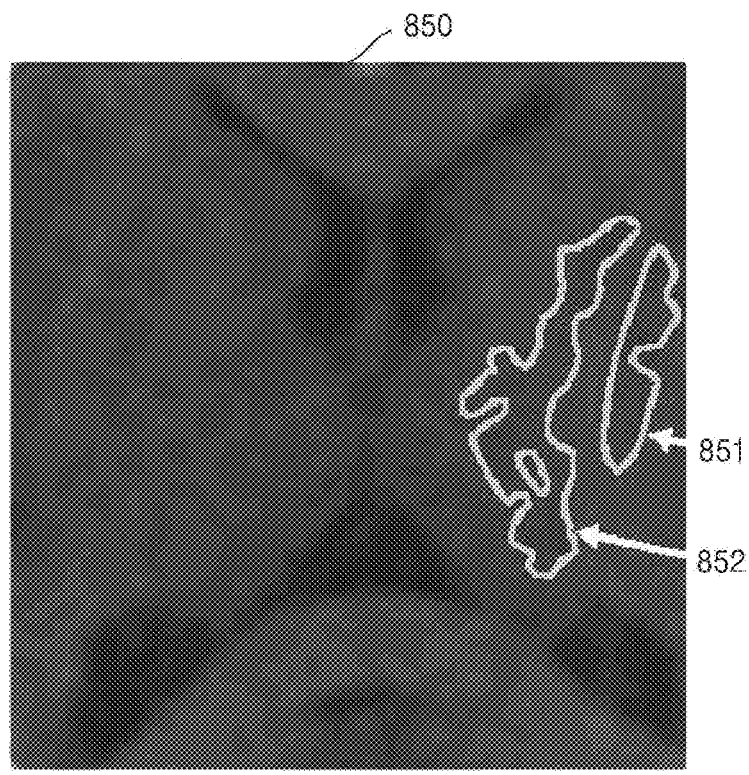

FIGS. 8A and 8B are magnetic resonance images obtained according to a GRAPPA method.

A magnetic resonance image 810 of FIG. 8A is a magnetic resonance image obtained by using multi-coil data according to a related art GRAPPA method. A magnetic resonance image 850 of FIG. 8B is an image obtained by magnifying a portion 820 of the magnetic resonance image 810.

Referring to FIG. 8B, noise and aliasing artifacts 851 and 852 exist in the magnetic resonance image 850 generated according to the related art GRAPPA method.

Figure 9A:
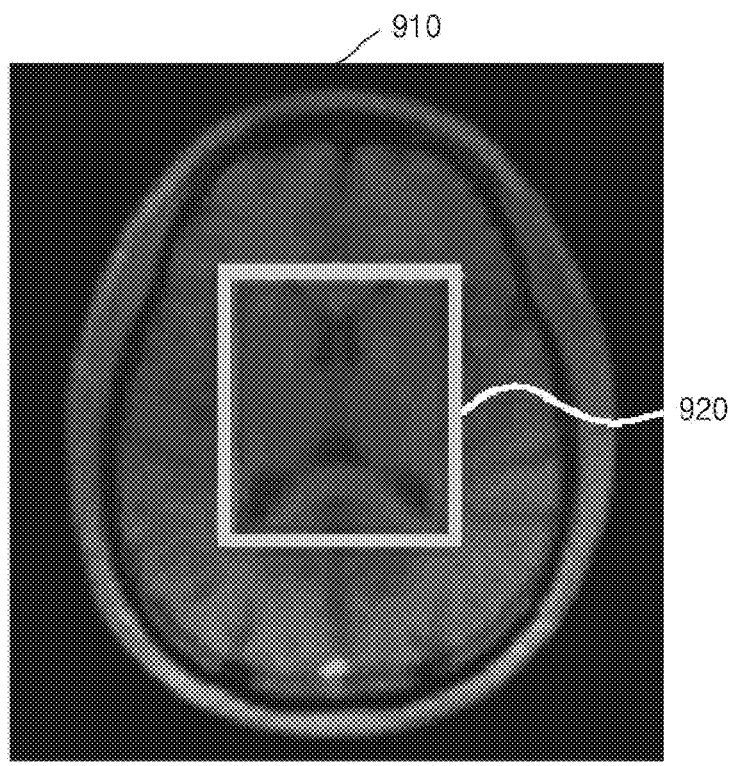
FIGS. 9A and 9B are magnetic resonance images obtained through a method and apparatus for generating a magnetic resonance image, according to an exemplary embodiment.
Figure 9B:
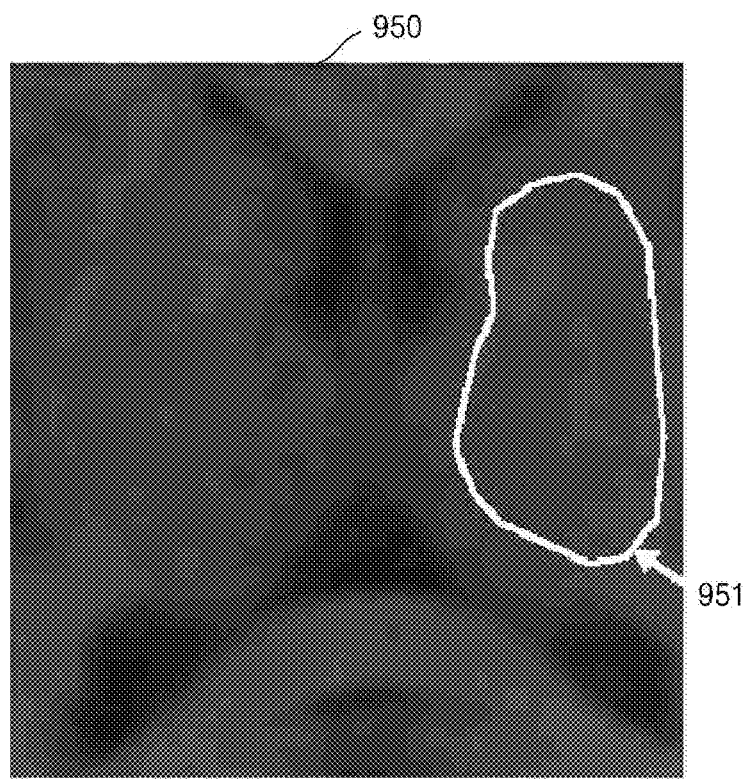

FIGS. 9A and 9B are magnetic resonance images obtained by a method and apparatus for generating a magnetic resonance image, according to an exemplary embodiment.

Referring to FIG. 9A, a magnetic resonance image 910 obtained by a method and apparatus for generating a magnetic resonance image, according to an exemplary embodiment is illustrated. A magnetic resonance image 950 of FIG. 9B is an image obtained by magnifying a portion 920 of the magnetic resonance image 910.

Referring to FIG. 9B, when comparing a portion 951 of the magnetic resonance image 950 with a portion 820 of FIG. 8B, in which noise and aliasing artifacts 851 and 852 exist, noise and aliasing artifacts are almost non-existent in the magnetic resonance image 950.

Figure 10:
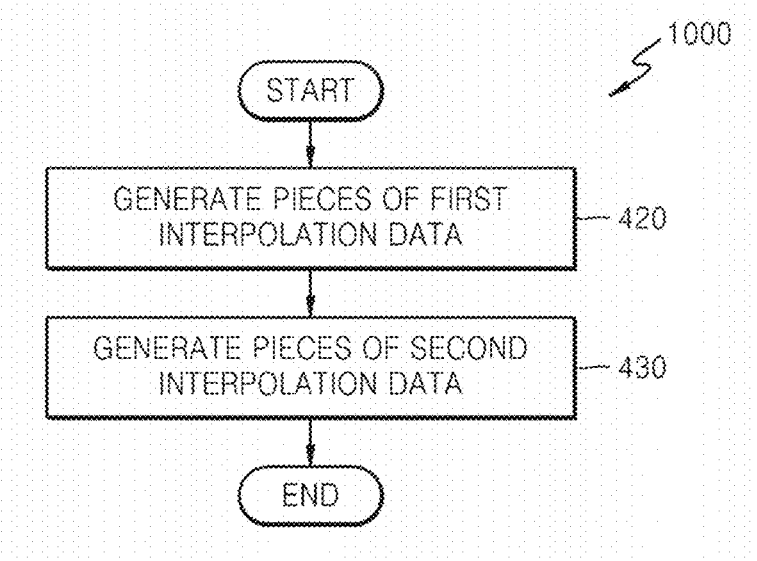
FIG. 10 is a flowchart illustrating a method of generating a magnetic resonance image, according to an exemplary embodiment.

FIG. 10 is a flowchart illustrating a method 1000 of generating a magnetic resonance image, according to an exemplary embodiment. The method 1000 is a method for obtaining a magnetic resonance image by using an RF multi-coil including a plurality of coils.

In operation 1010, pieces of the first interpolation data are generated by interpolating pieces of data obtained from a plurality of coils. Operation 1010 may be performed by the first interpolator 513. Operation 1010 corresponds to operation 620 of FIG. 6, and thus, a detailed description thereof is not provided.

In operation 1020, the second interpolation data sets are generated by interpolating data corresponding to the pieces of first interpolation data generated in operation 1010. Operation 1020 may be performed by the second interpolator 535. Operation 1020 corresponds to operation 641 of FIG. 6, and thus, a detailed description thereof is not provided.

As described above, methods and apparatuses for generating a magnetic resonance image, according to an exemplary embodiment, process interpolation data with respect to each of a plurality of frequency bands and obtain a magnetic resonance image by using data processed in each of the plurality of frequency bands, and thus, noise and aliasing artifacts occurring in a process of restoring a magnetic resonance image may be reduced. Thus, a magnetic resonance image may be more correctly reconstructed.

The foregoing exemplary embodiments and advantages are merely exemplary and are not to be construed as limiting. The present teaching can be readily applied to other types of apparatuses. Also, the description of the exemplary embodiments is intended to be illustrative, and not to limit the scope of the claims, and many alternatives, modifications, and variations will be apparent to those skilled in the art.

What is claimed is:

1. A method of generating a magnetic resonance image by using a radio frequency (RF) multi-coil including a plurality of coils, the method comprising:
   generating pieces of first interpolation data by interpolating pieces of data obtained from each of the plurality of coils;
   generating weighted data sets by weighting the pieces of first interpolation data with respect to a plurality of frequency bands; and
   obtaining the magnetic resonance image corresponding to a subject by using the weighted data sets,
   the obtaining the magnetic resonance image comprising:
   generating pieces of a second interpolation data set by interpolating pieces of at least one of the weighted data sets corresponding to one of the plurality of frequency bands;
   obtaining a plurality of reconstructed images corresponding to the plurality of coils by performing a weighted combination on at least one of the weighted data sets and the second interpolation data set; and
   obtaining the magnetic resonance image by using the plurality of reconstructed images.

2. The method of claim 1, wherein the generating the weighted data sets comprises performing K-space weighting on the pieces of first interpolation data in a K-space with respect to the plurality of frequency bands.

3. The method of claim 2, wherein the plurality of frequency bands comprise a low frequency band and RF bands, and the generating the weighted data sets comprises:
   generating pieces of a first weighted data set corresponding to the low frequency band by low-pass filtering the pieces of the first interpolation data; and
   generating pieces of second weighted data sets corresponding to the RF bands by high-pass filtering the pieces of the first interpolation data by applying different weighting values.

4. The method of claim 1, wherein the generating the pieces of the second interpolation data set comprises interpolating the pieces of the weighted data set by using a convolution interpolation method.

5. The method of claim 1, wherein the obtaining the magnetic resonance image comprises:
   performing an inverse fast Fourier transform on the plurality of reconstructed images; and
   obtaining the magnetic resonance image based on the inverse fast Fourier transformed-reconstructed images.

6. The method of claim 5, wherein the obtaining the magnetic resonance image comprises obtaining the magnetic resonance image by summing squares of the inverse fast Fourier transformed-reconstructed images.

7. The method of claim 1, wherein the generating pieces of first interpolation data comprises interpolating the pieces of data by using a convolution interpolation method.

8. The method of claim 1, where in the pieces of the first interpolation data comprise individual coil datasets of each of the plurality of RF coils, respectively, and
   the generating weighted data sets comprises applying a number of different weights in a range from 0 to 1 in each of the plurality of frequency bands, respectively, to the individual coil datasets.

9. An apparatus for generating a magnetic resonance image, the apparatus comprising:
   a data processor that generates pieces of first interpolation data by interpolating pieces of data obtained from each of a plurality of coils;
   a frequency band-based processor that generates weighted data sets by weighting the pieces of first interpolation data with respect to a plurality of frequency bands; and
   an image generator that obtains a magnetic resonance image corresponding to a subject by using the weighted data sets, and comprises:
   a second interpolator that generated pieces of a second interpolation data set by interpolating pieces if one of the weighted data sets corresponding to one of the plurality of frequency bands;
   a reconstruction processor that obtains a plurality of reconstructed images corresponding to the plurality of coils by using at least one of the weighted data sets and the second interpolation data set; and
   a magnetic resonance image generator that obtains the magnetic resonance image by using the plurality of reconstructed images.

10. The method of claim 9, wherein the frequency band-based processor generates the weighted data sets by performing K-space weighting on the pieces of first interpolation data in a K-space with respect to the plurality of frequency bands.

11. The method of claim 9, wherein the frequency band-based processor comprises:
    at least one low-pass filter that generates pieces of a first weighted data set by low-pass filtering the pieces of first interpolation data; and
    a high-pass filter unit including a plurality of high-pass filters that each high-pass filters the pieces of first interpolation data by applying a predetermined weighting value,
    wherein different weighting values are applied to the plurality of high-pass filters.

12. The method of claim 11, wherein the
    second interpolator generates pieces of second interpolation data sets corresponding to the plurality of high-pass filters, respectively, by interpolating pieces of the weighted data sets, which are output from the plurality of high-pass filters, by using a convolution interpolation method; and
    the reconstruction processor generates the plurality of reconstructed images by performing a weighted combination on the pieces of the first weighted data set, which is output from the low-pass filter, and the pieces of the second interpolation data sets, with respect to each of the plurality coils.

13. The method of claim 9, wherein the data processor comprises:
    a data receiver that receives the pieces of data; and
    a first interpolator that generates the pieces of first interpolation data by interpolating the pieces of data corresponding to the plurality of coils by using a convolution interpolation method.

14. The method of claim 9, wherein the magnetic resonance image generator performs an inverse fast Fourier transform on the plurality of reconstructed images and obtains the magnetic resonance image based on the inverse fast Fourier transformed-reconstructed images.

15. The method of claim 14, wherein the magnetic resonance image generator obtains the magnetic resonance image by summing squares of the inverse fast Fourier transformed-reconstructed images.

16. The method of claim 9, wherein the reconstruction processor obtains the plurality of reconstructed images corresponding to the plurality of coils by performing a weighted combination on at least one of the weighted data sets and the second interpolation data set.

17. A method of obtaining a magnetic resonance image by using a radio frequency (RF) multi-coil including a plurality of coils, the method comprising:
  generating pieces of first interpolation data by interpolating pieces of data obtained from the plurality of coils; and
  generating weighted data sets by weighting the pieces of first interpolation data with at least three different weights from 0 to 1;
  generating pieces of second interpolation data by interpolating pieces of at least one of the weighted data sets;
  obtaining reconstructed images corresponding to the plurality of coils by performing a weighted combination on at least one of the weighted data sets and the second interpolation data; and
  obtaining a magnetic resonance image by using the reconstructed image.

18. A magnetic resonance imaging (MRI) method comprising:
  obtaining data sets from corresponding individual radio frequency (RF) coils of an MR scanner;
  generating pieces of a first interpolation data set by interpolating pieces of the data sets;
  generating weighted data sets by weighting the pieces of first interpolation data set in a plurality of frequency bands;
  generating coil images corresponding to each of the individual RF coils, by combining corresponding data pieces of the weighted data sets; and
  obtaining the magnetic resonance image of an imaged object by combining the coil images,
  wherein the plurality of frequency bands comprises a low frequency band and RF bands,
  the generating the weighted data sets comprises generating pieces of a first weighted data set corresponding to the low frequency band by low-pass filtering the pieces of the first interpolation data set with a low-pass filter, and generating pieces of second weighted data sets corresponding to the RF bands by filtering the pieces of the first interpolation data set with high-pass by applying different weighting values,
  the method further comprises generating second interpolation data sets by interpolating pieces of the second weighted data sets prior to the generating the coil images, and
  the generating the coil images comprises combining the data pieces corresponding to each of the individual RF coils of the first weighted data set and the second interpolation data sets.

* * * * *